US009933823B2

United States Patent
Chen et al.

(10) Patent No.: US 9,933,823 B2
(45) Date of Patent: Apr. 3, 2018

(54) COMPONENT TRAY HOLDER WITH SLIM SIDE RAILS

(71) Applicant: Quanta Computer Inc., Taoyuan (TW)

(72) Inventors: Chao-Jung Chen, Taoyuan (TW); Yaw-Tzorng Tsorng, Taoyuan (TW); Kun-Pei Liu, Taoyuan (TW); Yi-Te Chang, Taoyuan (TW)

(73) Assignee: QUANTA COMPUTER INC., Taoyuan ( * ) Notice: Subject to any disclaimer, the term of this patent is extended or adjusted under 35 U.S.C. 154(b) by 73 days.

(21) Appl. No.: 15/150,376

(22) Filed: May 9, 2016

(65) Prior Publication Data

US 2017/0090528 A1    Mar. 30, 2017

Related U.S. Application Data

(60) Provisional application No. 62/222,939, filed on Sep. 24, 2015.

(51) Int. Cl.
| | |
|---|---|
| *G06F 1/18* | (2006.01) |
| *G11B 33/02* | (2006.01) |
| *H05K 7/14* | (2006.01) |
| *H05K 7/20* | (2006.01) |
| *G11B 33/12* | (2006.01) |

(52) U.S. Cl.
CPC ............ *G06F 1/187* (2013.01); *G11B 33/022* (2013.01); *G11B 33/128* (2013.01);
(Continued)

(58) Field of Classification Search
CPC ..... G11B 33/022; G11B 33/128; G06F 1/187; H05K 7/1487; H05K 7/1489;
(Continued)

(56) References Cited

U.S. PATENT DOCUMENTS

| | | | |
|---|---|---|---|
| 6,733,223 B2 * | 5/2004 | Mueller | G11B 15/6835 414/280 |
| 7,104,618 B2 * | 9/2006 | Chaloner | G11B 15/6835 312/9.43 |

(Continued)

FOREIGN PATENT DOCUMENTS

| | | |
|---|---|---|
| CN | 103796472 A | 5/2014 |
| TW | M500933 U | 5/2015 |
| TW | 201531204 A | 8/2015 |

OTHER PUBLICATIONS

Taiwanese Office Action for Application No. 105119637, dated Nov. 14, 2016 w/ English First Action Summary.

*Primary Examiner* — Patrick D Hawn
(74) *Attorney, Agent, or Firm* — Nixon Peabody LLP; Eduardo J. Quinones; Zhou Lu

(57) ABSTRACT

A retractable component tray holder includes: an outer tray having first and second outer tray sidewalls, and a bottom; an inner tray configured to retract into and extend from the outer tray, the inner tray having a first inner tray sidewall and a bottom; a fan chassis configured to receive at least one fan, the fan chassis being adjacent a rear of the inner tray; a bottom support assembly comprising a first bottom support slideably mounted on the bottom of the outer tray, a second bottom support slideably mounted on the first bottom support, and the inner tray being slideably mounted on the second bottom support; and a second side support assembly comprising a side support slideably mounted on the second sidewall, a bracket slideably mounted on the side support, and the fan chassis mounted on the bracket.

20 Claims, 20 Drawing Sheets

(52) U.S. Cl.
CPC ......... *H05K 7/1487* (2013.01); *H05K 7/1489* (2013.01); *H05K 7/20136* (2013.01); *H05K 7/20172* (2013.01); *H05K 7/20718* (2013.01); *H05K 7/20736* (2013.01)

(58) Field of Classification Search
CPC ........... H05K 7/20136; H05K 7/20172; H05K 7/20718; H05K 7/20736
See application file for complete search history.

(56) References Cited

U.S. PATENT DOCUMENTS

| | | | | |
|---|---|---|---|---|
| 7,864,538 | B2 * | 1/2011 | Wadsworth | G11B 33/10 361/679.02 |
| 8,570,743 | B2 * | 10/2013 | Pang | H05K 7/20172 248/220.21 |
| 9,456,515 | B2 * | 9/2016 | Pecone | H05K 13/00 |
| 2003/0049105 | A1 * | 3/2003 | Mueller | G11B 15/6835 414/277 |
| 2010/0054685 | A1 * | 3/2010 | Cooke | G02B 6/4455 385/135 |
| 2012/0134086 | A1 * | 5/2012 | Zhang | G06F 1/181 361/679.02 |
| 2013/0278124 | A1 * | 10/2013 | Hu | A47B 96/025 312/333 |
| 2014/0204525 | A1 * | 7/2014 | Pecone | H05K 13/00 361/679.33 |
| 2014/0265794 | A1 * | 9/2014 | Schroeder | H05K 7/183 312/334.46 |
| 2015/0201522 | A1 * | 7/2015 | Jau | G11B 33/128 312/330.1 |

\* cited by examiner

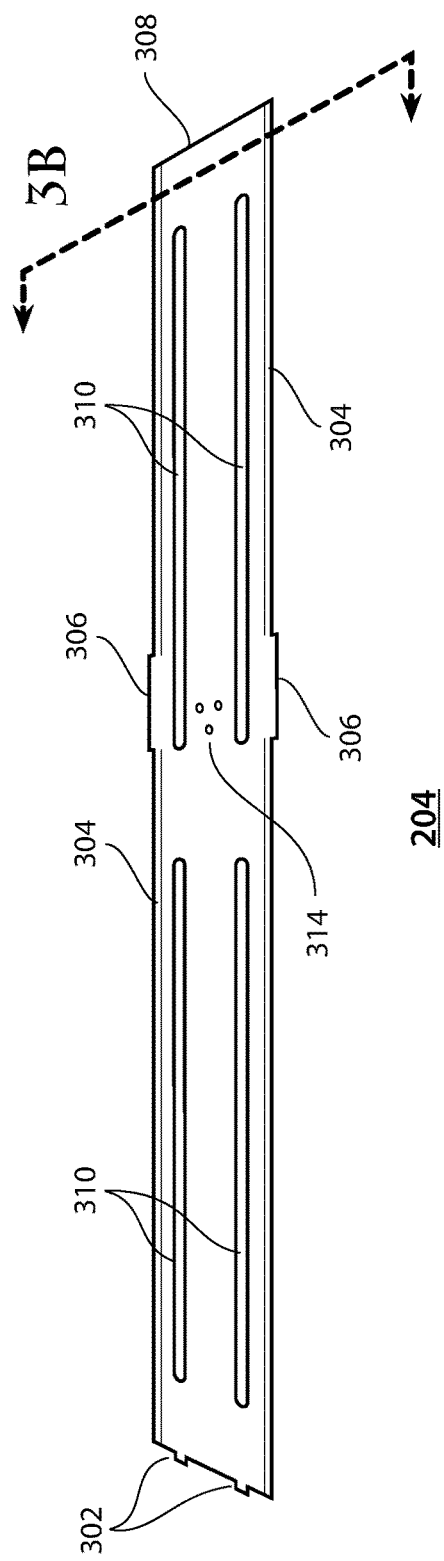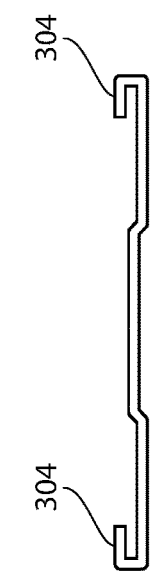
FIG. 3A
FIG. 3B

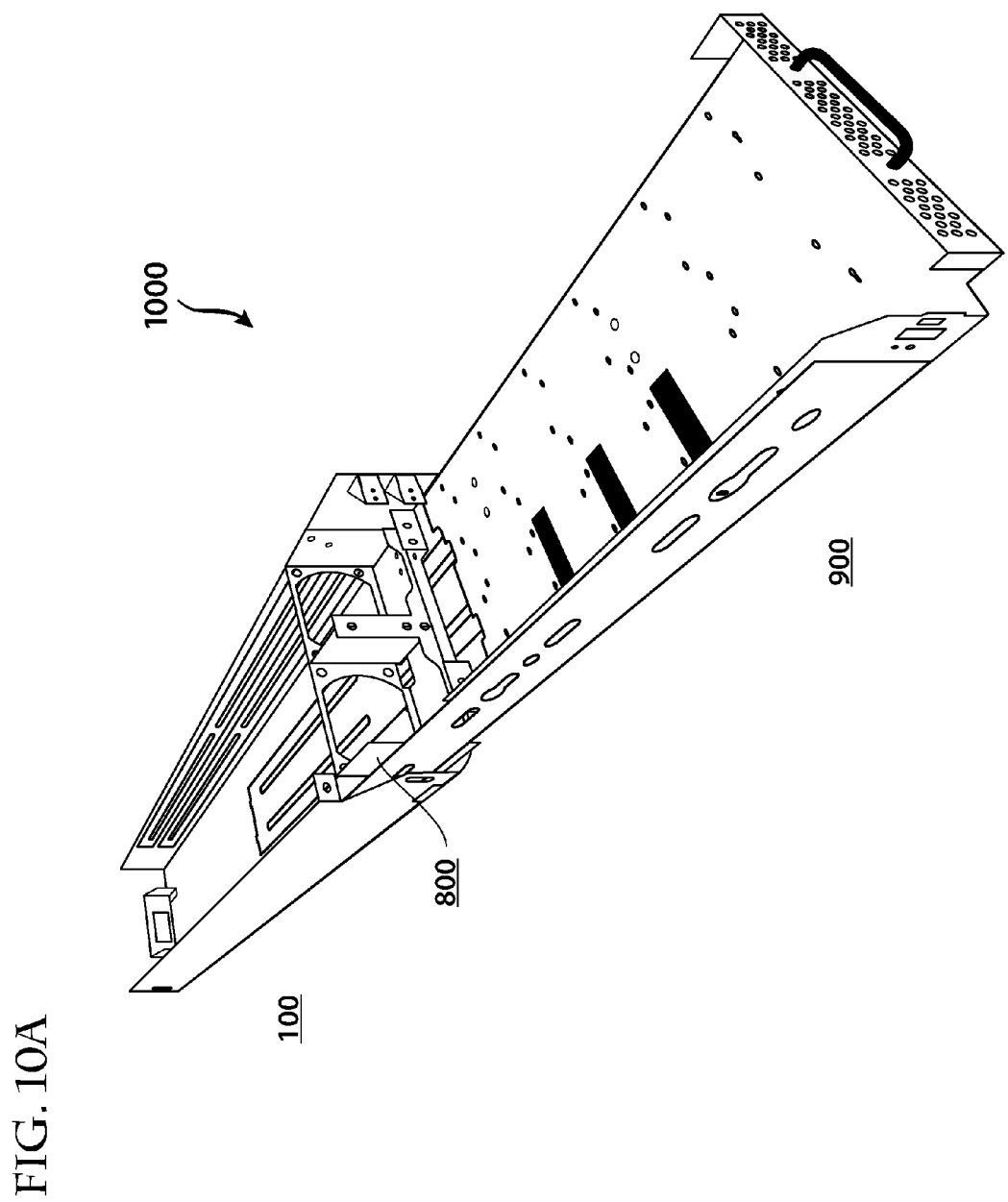

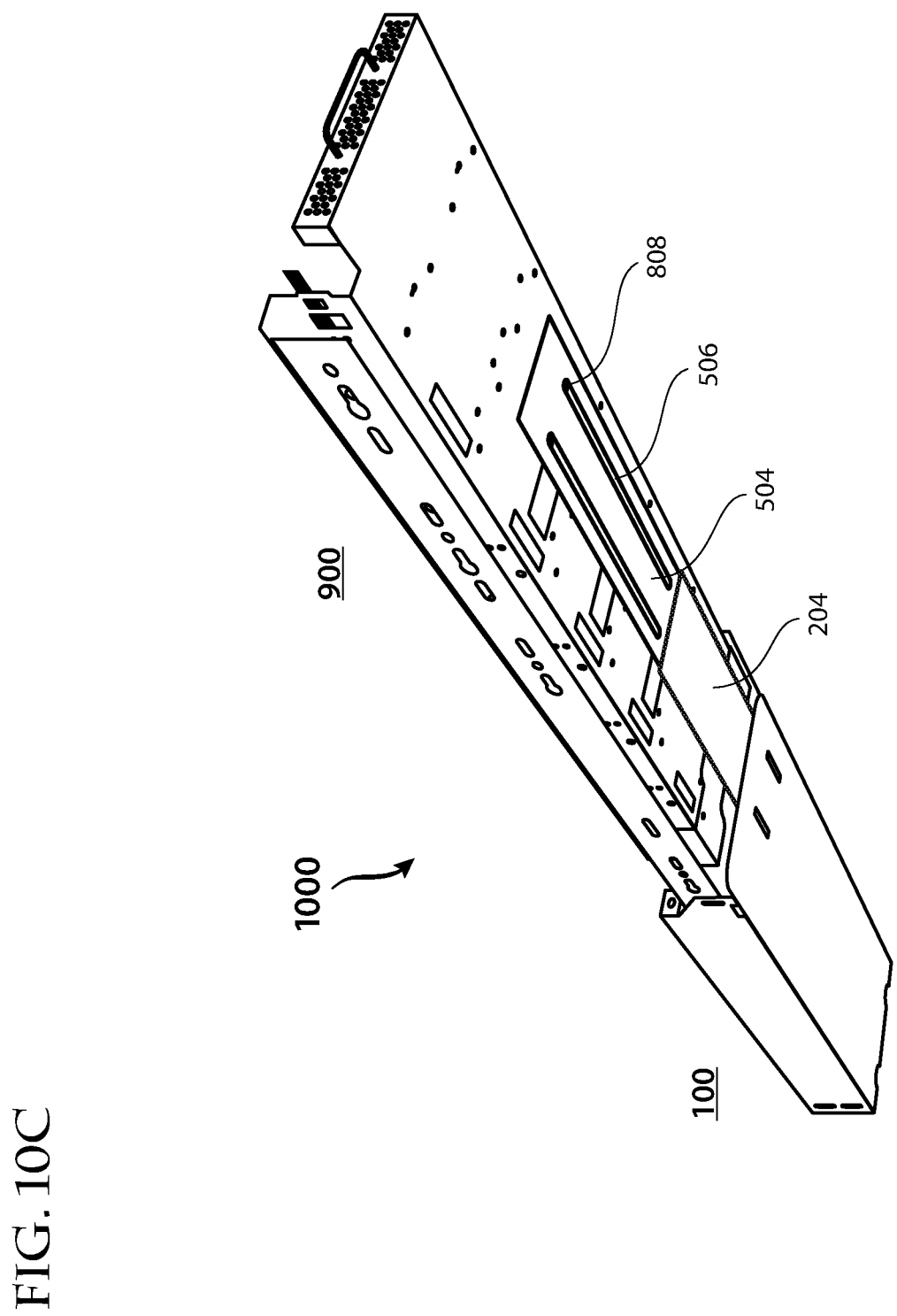

COMPONENT TRAY HOLDER WITH SLIM SIDE RAILS

CROSS REFERENCE TO RELATED APPLICATIONS

The instant application claims priority to U.S. Provisional Application No. 62/222,939 entitled "Extra slim slide rail like support bracket design", filed Sep. 24, 2015, the contents of which are expressly incorporated by reference in its entirety.

FIELD OF THE INVENTION

The various embodiments described herein relate generally to a component tray holder with side rails. More specifically, various embodiments described herein generally relate to a component tray holder with a slideably inner tray that relies upon slim support brackets rather than wheels.

BACKGROUND

Hard drives are typically housed in a server chassis and are used for storing information in a server. Conventionally, the hard drives can be housed at the front of the server chassis for access to the hard drives for the purpose of replacement or maintenance. At times, it may be desirable to maximize the storage capacity of the server by housing many hard drives inside the chassis. However, due to space limitations of the server chassis, only a limited amount of hard drives can be housed in the server at once, and, of those hard drives, only a limited number of hard drives can be easily accessible from the front for the purpose of replacement or maintenance.

The hard drives themselves may be stored in retractable trays that extend horizontally from the server chassis. Traditional trays are supported from the sides, and require a certain degree of strength, rigidity and mechanical complexity to support the tray and mounted hard drive. This requires a minimum width in an environment with space limitations. The structure to support the sides is also cumbersome and expensive to manufacture.

SUMMARY OF THE INVENTION

According to an embodiment of the invention, a retractable component tray holder is provided. The holder includes: an outer tray having first and second outer tray sidewalls, and a bottom; an inner tray configured to retract into and extend from the outer tray, the inner tray having a first inner tray sidewall and a bottom; a fan chassis configured to receive at least one fan, the fan chassis being adjacent a rear of the inner tray; a first side support assembly comprising an inner section attached to the first outer tray sidewall and a nested outer section attached to the first inner tray sidewall; a bottom support assembly comprising a first bottom support slideably mounted on the bottom of the outer tray, a second bottom support slideably mounted on the first bottom support, and the inner tray being slideably mounted on the second bottom support; and a second side support assembly comprising a side support slideably mounted on the second sidewall, a bracket slideably mounted on the side support, and the fan chassis mounted on the bracket.

The above embodiment may have various features. The first bottom support may have at least one groove and is slideably attached to an upper face of the bottom of the outer tray by at least one fastener through the at least one groove. The bottom of the outer tray may have upwardly extending gripping flanges, the first bottom support may have outwardly extending flanges, and when the first bottom support slides into an extended position the extending flanges may slide into overlapping engagement with the gripping flanges. The first bottom support may have side tracks to receive and support the second bottom support, the side tracks being closer together than the gripping flanges such that the first bottom support slides between the gripping flanges. The second bottom support may have at least one groove and is slideably attached to the bottom of the inner tray by at least one fastener through the at least one groove. The side support may have at least one groove and is slideably attached to the second sidewall of the inner tray by at least one fastener through the at least one groove. The side support may have a central groove, and the bracket is sliding mounted to the central groove by a fastener. The side support may have at least one groove above and below the central groove and is slideably attached to the second sidewall of the inner tray by at least one fastener through the at least one groove. The inner tray may be directly connected to the first side support assembly and the bottom support assembly, and indirectly connected to the second side support assembly. The inner tray may lack a second sidewall corresponding to the second sidewall of the outer tray.

According to another embodiment of the invention, a retractable component tray holder is provided. The holder includes: an outer tray having first and second outer tray sidewalls, and a bottom; an inner tray configured to retract into and extend from the outer tray, the inner tray having a first inner tray sidewall and a bottom; a fan chassis configured to receive at least one fan, the fan chassis being adjacent a rear of the inner tray; a first side support assembly comprising an inner section attached to the first outer tray sidewall and a nested outer section attached to the first inner tray sidewall; a bottom support assembly comprising a first bottom support slideably mounted on the bottom of the outer tray, a second bottom support slideably mounted on the first bottom support, and the inner tray being slideably mounted on the second bottom support; and a second side support assembly comprising a side support slideably mounted on the second sidewall, a bracket slideably mounted on the side support, and the fan chassis mounted on the bracket. The inner tray is directly connected to the first side support assembly and the bottom support assembly, and indirectly connected to the second side support assembly. The inner tray lacks a second sidewall corresponding to the second sidewall of the outer tray.

The above embodiment may have various features. The first bottom support may have at least one groove and is slideably attached to an upper face of the bottom of the outer tray by at least one fastener through the at least one groove. The bottom of the outer tray may have upwardly extending gripping flanges, the first bottom support may have outwardly extending flanges, and when the first bottom support slides into an extended position the extending flanges may slide into overlapping engagement with the gripping flanges. The first bottom support may have side tracks to receive and support the second bottom support, the side tracks being closer together than the gripping flanges such that the first bottom support slides between the gripping flanges. The second bottom support may have at least one groove and is slideably attached to the bottom of the inner tray by at least one fastener through the at least one groove. The side support may have at least one groove and is slideably attached to the second sidewall of the inner tray by at least one fastener through the at least one groove. The side support may have a central groove, and the bracket is sliding mounted to the central groove by a fastener. The side support may have at least one groove above and below the central groove and is slideably attached to the second sidewall of the inner tray by at least one fastener through the at least one groove.

Details of one or more implementations are set forth in the accompanying drawings and the description below. Other features, aspects, and potential advantages will be apparent from the description and drawings, and from the claims.

BRIEF DESCRIPTION OF THE DRAWINGS

Various embodiments in accordance with the present disclosure will be described with reference to the drawings, in which:

FIGS. 3A and 3B are top and cross section views of a lower side bracket of FIG. 2A according to an embodiment of the invention.

FIGS. 10A-10C are perspective views of a completed assembly according to any embodiment of the invention.

DETAILED DESCRIPTION

In the following description, various embodiments will be illustrated by way of example and not by way of limitation in the Figures of the accompanying drawings. References to various embodiments in this disclosure are not necessarily to the same embodiment, and such references mean at least one. While specific implementations and other details are discussed, it is to be understood that this is done for illustrative purposes only. A person skilled in the relevant art will recognize that other components and configurations may be used without departing from the scope and spirit of the claimed subject matter.

Several definitions that apply throughout this disclosure will now be presented. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" when utilized, means "including, but not necessarily limited to"; it specifically indicates open-ended inclusion or membership in the so-described combination, group, series and the like. The term "a" means "one or more" unless the context clearly indicates a single element.

As used herein, the term "front", "rear", "left," "right," "top" and "bottom" or other terms of direction, orientation, and/or relative position are used for explanation and convenience to refer to certain features of this disclosure. However, these terms are not absolute, and should not be construed as limiting this disclosure.

Shapes as described herein are not considered absolute. As is known in the server art, surfaces often have waves, protrusions, holes, recess, etc. to provide rigidity, strength and functionality. All recitations of shape (e.g., "C-shaped," "C-track," or "L-bracket") herein are to be considered modified by "substantially" regardless of whether expressly stated in the disclosure or claims, and specifically accounts for variations in the art as noted above.

Figure 1A:
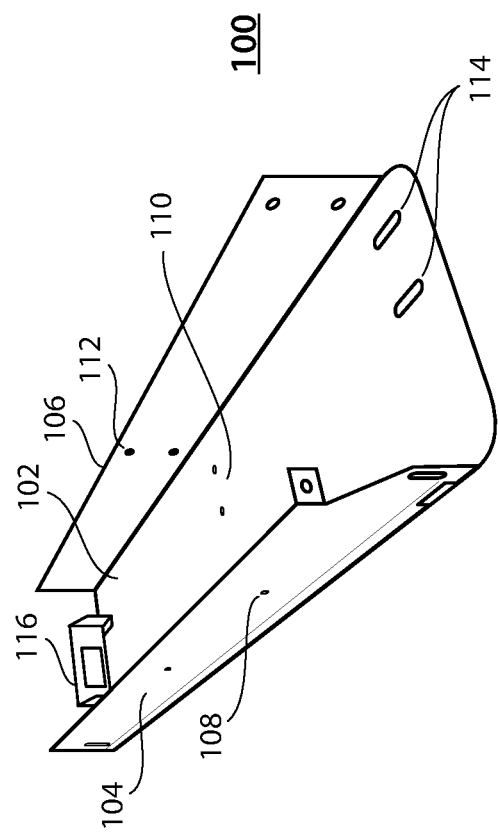
FIGS. 1A and 1B are perspective views of an outer tray according to an embodiment of the invention.
Figure 1B:
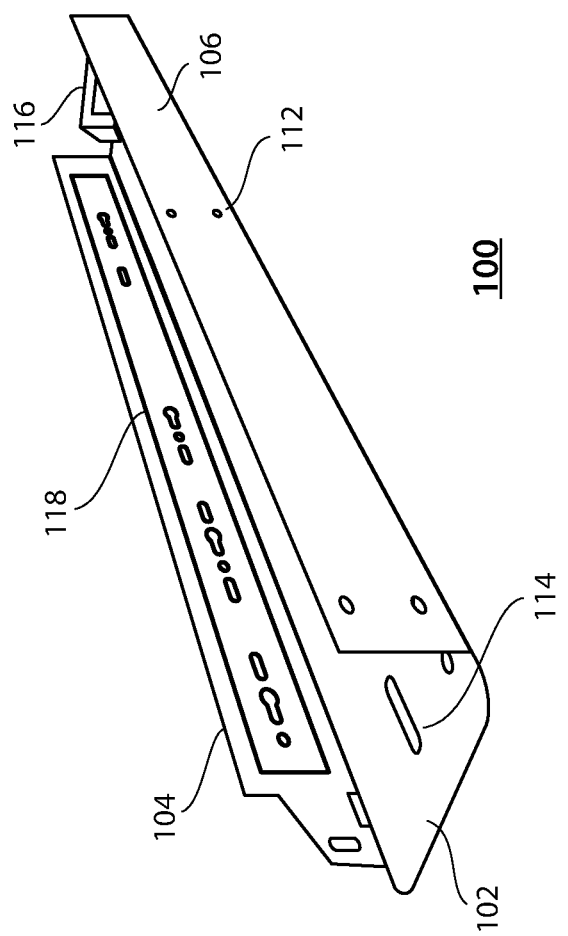

Referring now to FIGS. 1A and 1B, and outer tray 100 is shown. Outer tray 100 includes a bottom 102, a left sidewall 104, and a right sidewall 106. Various holes 108, 110, and 112 are punched in bottom 102, left sidewall 104 and right sidewall 106, respectively. Gripping flanges 114 protrude upward from bottom 102. A rear plate 116 act as a stopper to prevent anything mounted in outer tray 100 from sliding out of the rear end of outer tray 100. An inwardly facing C-shaped track 118, which is a first portion of a nested extendable arm, is mounted along left sidewall 104 in parallel with the bottom 102. Track 118 is preferably attached to left sidewall 104 via at least some of holes 108 using fasteners as are known in the art (e.g., rivets, screws, pins).

Figure 2A:
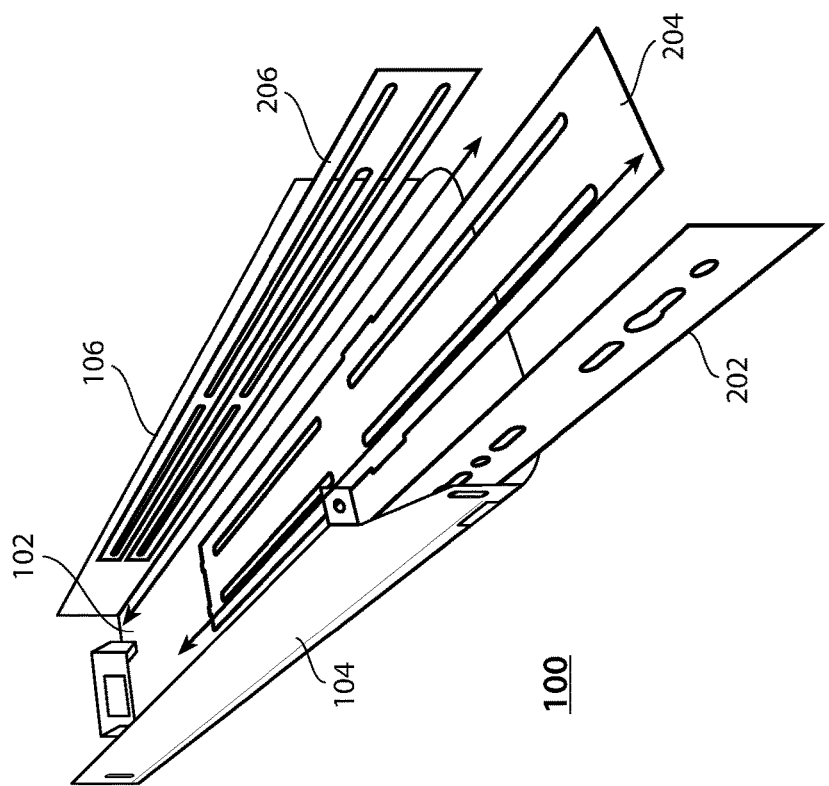
FIGS. 2A and 2B are perspective views of an outer tray of FIG. 1A with supporting elements according to an embodiment of the invention.
Figure 2B:
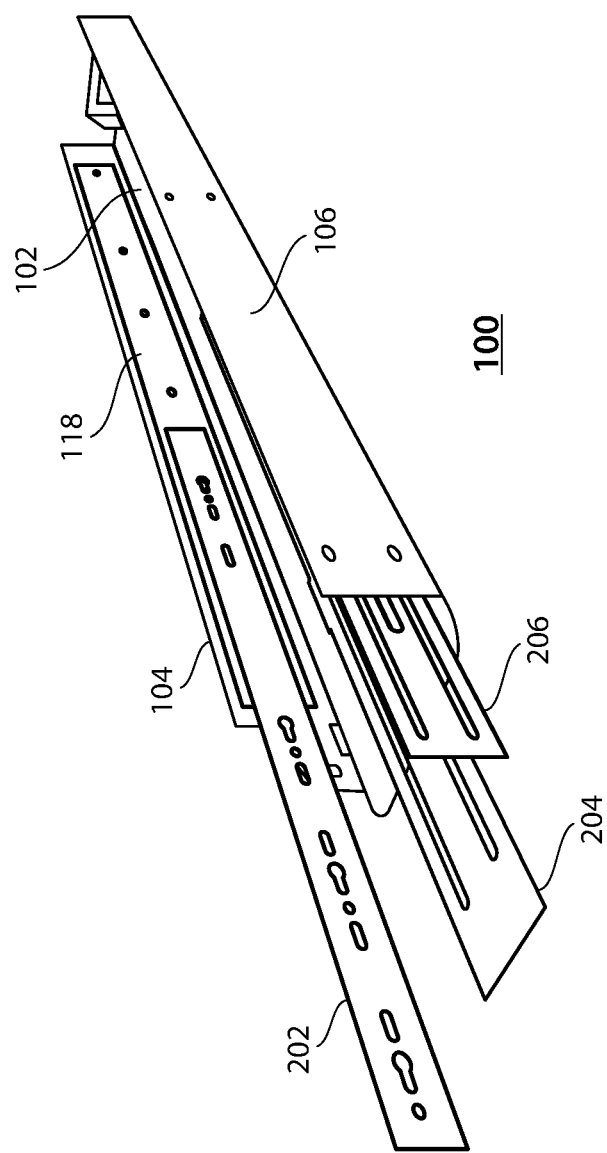

Referring now to FIGS. 2A and 2B, additional support components are shown mounted on outer tray 100. An outwardly facing C-shaped arm 202 is slideably nested within track 118. A first bottom support 204 is slideably mounted on bottom 102 to move front to back as described below. A side support 206 is slideably mounted on left sidewall 106 to move front to back as described below. FIGS. 2A and 2B show arm 202, first bottom support 204 and side support 206 in a deployed position, and all three are retractable into outer tray 100.

Referring now to FIGS. 3A and 3B, first bottom support 204 is shown in more detail. One or more stops 302 are mounted on the rear end of first bottom support 204 to prevent anything mounted thereon from moving further rearward of that point. First bottom support 204 has an overall C-shape cross section (best seen in FIG. 3B), with the left and right sides each having two sets of tracks 304. Between each set of tracks 304 is a pair of protruding flanges 306 which extend laterally from first bottom support 204 for a distance beyond the outer ends of tracks 304. A front 308 is open to receive another support as described below. Attachment holes 314 may be provided for a stop (such as click spring) as described below.

Figure 4:
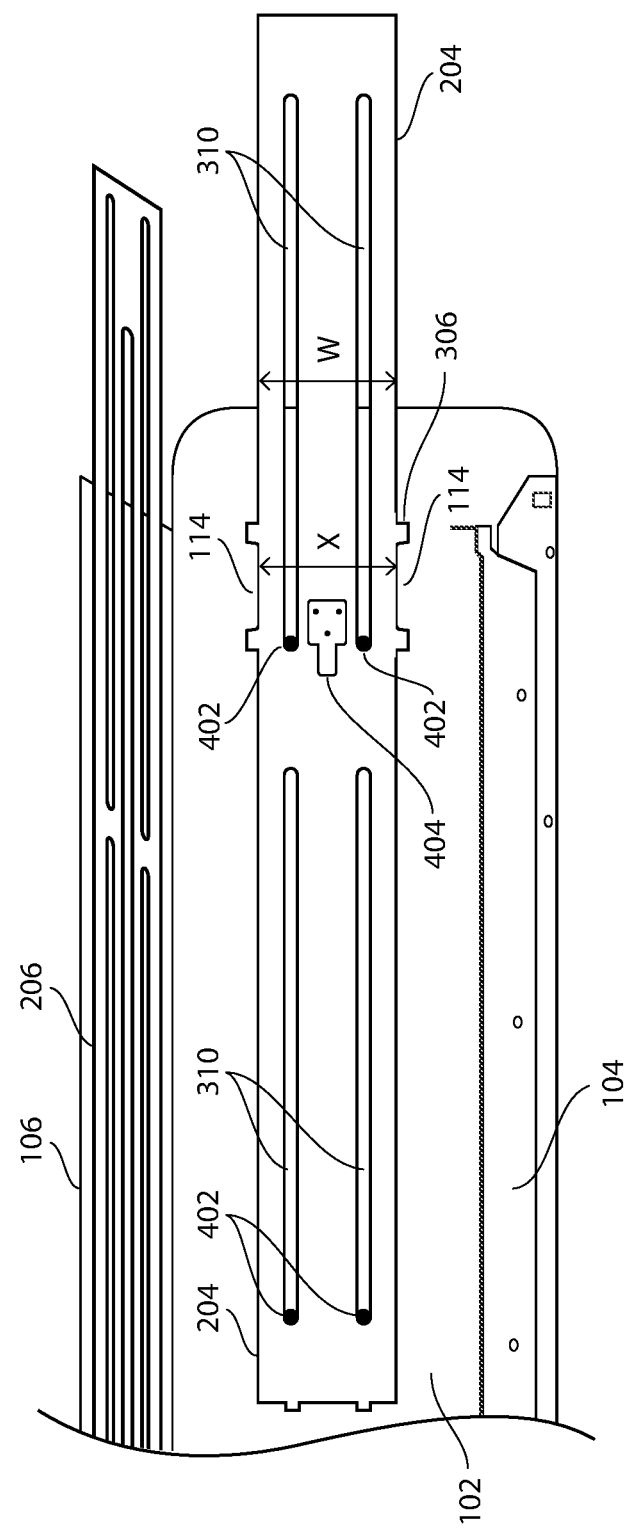
FIG. 4 is a top perspective view of the outer tray of FIG. 2A according to an embodiment of the invention.

Referring now to FIG. 4, first bottom support 204 is slideably mounted on bottom 102 via caped fasteners 402, such as rivets, that extend from beneath bottom 102 and through grooves 310. Four grooves 310 and fasteners 402 are shown, but the invention is not so limited and other numbers may be used, and particularly there may be more fasteners than grooves to provide additional support. FIG. 4 shows first bottom support 204 at maximum extension (which in FIG. 4 also corresponds to the deployed position, although the invention is not so limited), as the rear end of grooves 310 have engaged fasteners 402. Conversely, first bottom support 204 has a maximum retraction into outer tray 100 when the front end of grooves 310 engages fasteners 402.

The lateral distance X between gripping flanges 114 is larger than the outer width W of the tracks 304 of first bottom support 204, such that first bottom support 204 will slide between flanges 114 without interference. Protruding flanges 306 of first bottom support 204 are positioned such they slide beneath gripping flanges 114 when first bottom support is in its deployed position. Gripping flanges 114 thus engage protruding flanges 306 to provide additional support for first bottom support 204.

A stop 404 such as a click spring may be mounted on holes 314 to prevent excessive movement of objects mounted on first bottom support 204 as discussed in more detail below.

Figure 5A:
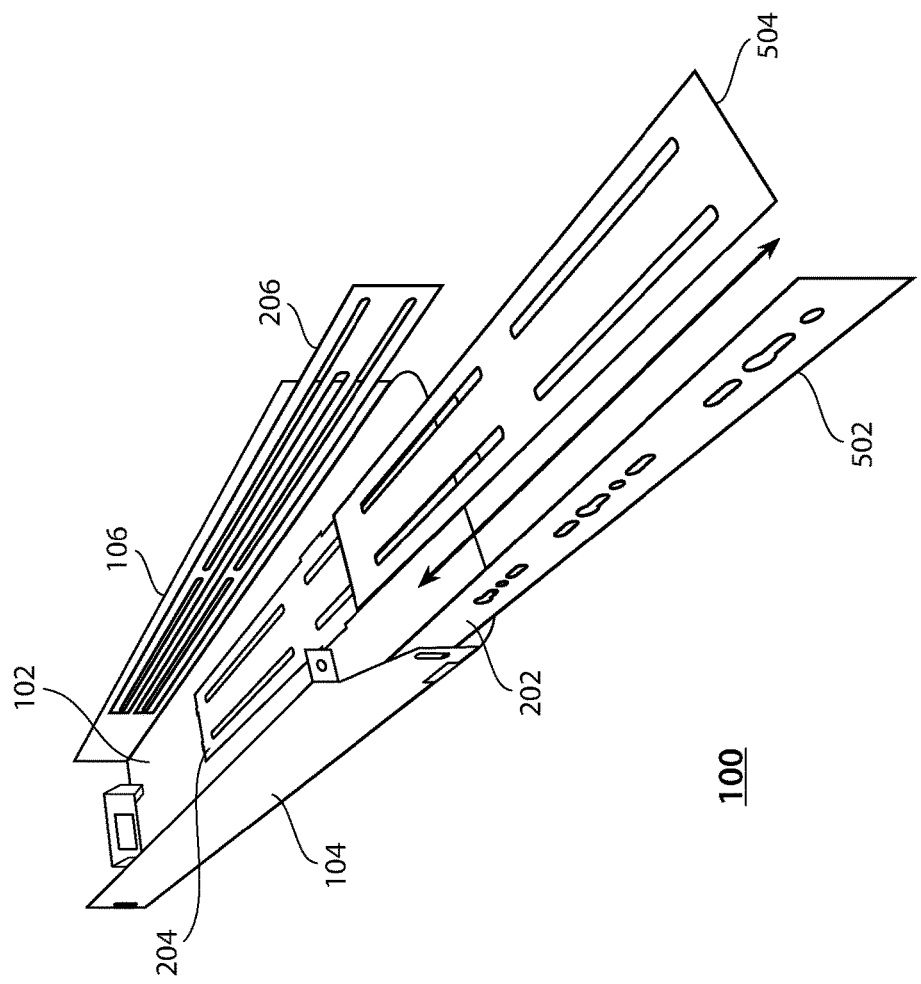
FIGS. 5A and 5B are perspective views of the outer tray of FIG. 2A with additional supporting elements according to an embodiment of the invention.
Figure 5B:
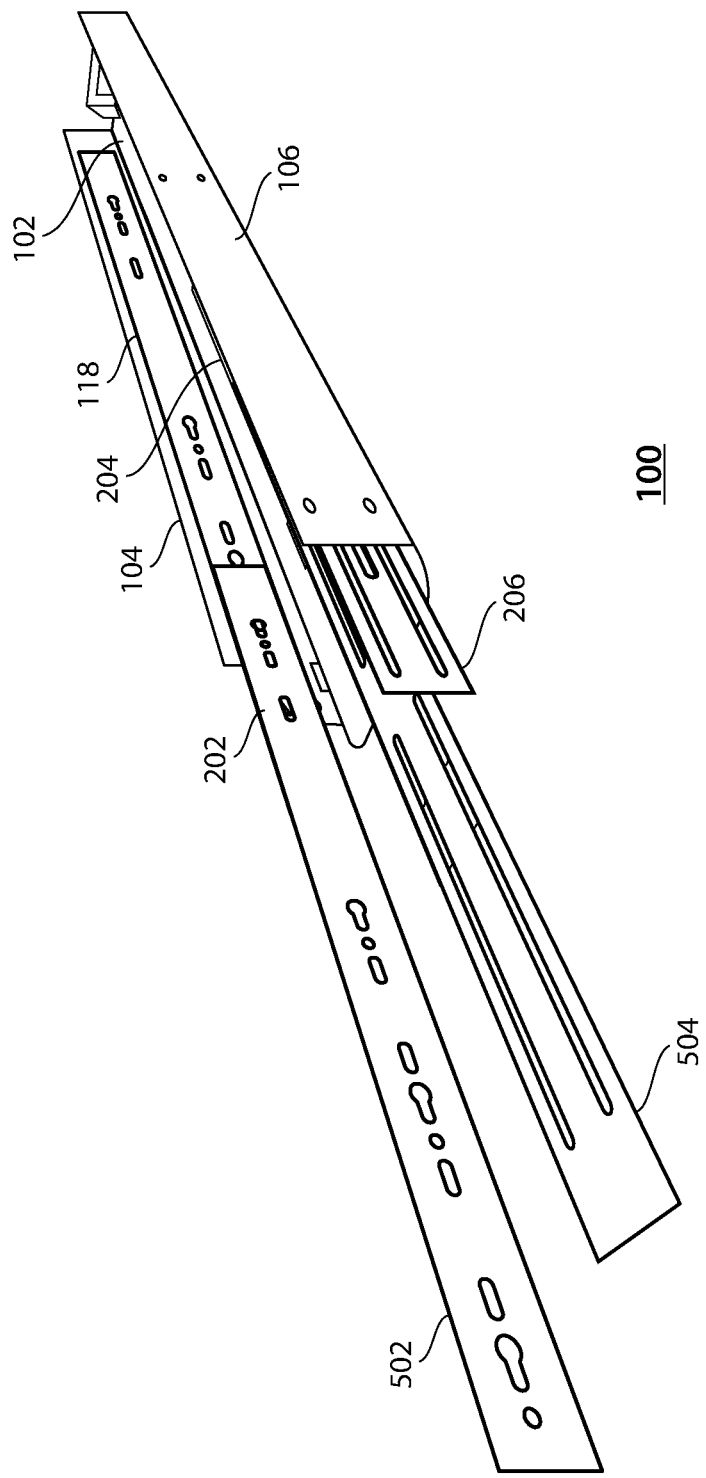

Referring now to FIGS. 5A and 5B, additional support component are shown mounted on outer tray 100. An inwardly facing C-shaped arm 502 is slideably nested within arm 202, which itself is slideably nested in track 118. Track 118, arm 202 and arm 502 collectively define a nested extension that can deploy from and retract into outer tray 100.

Figure 5C:
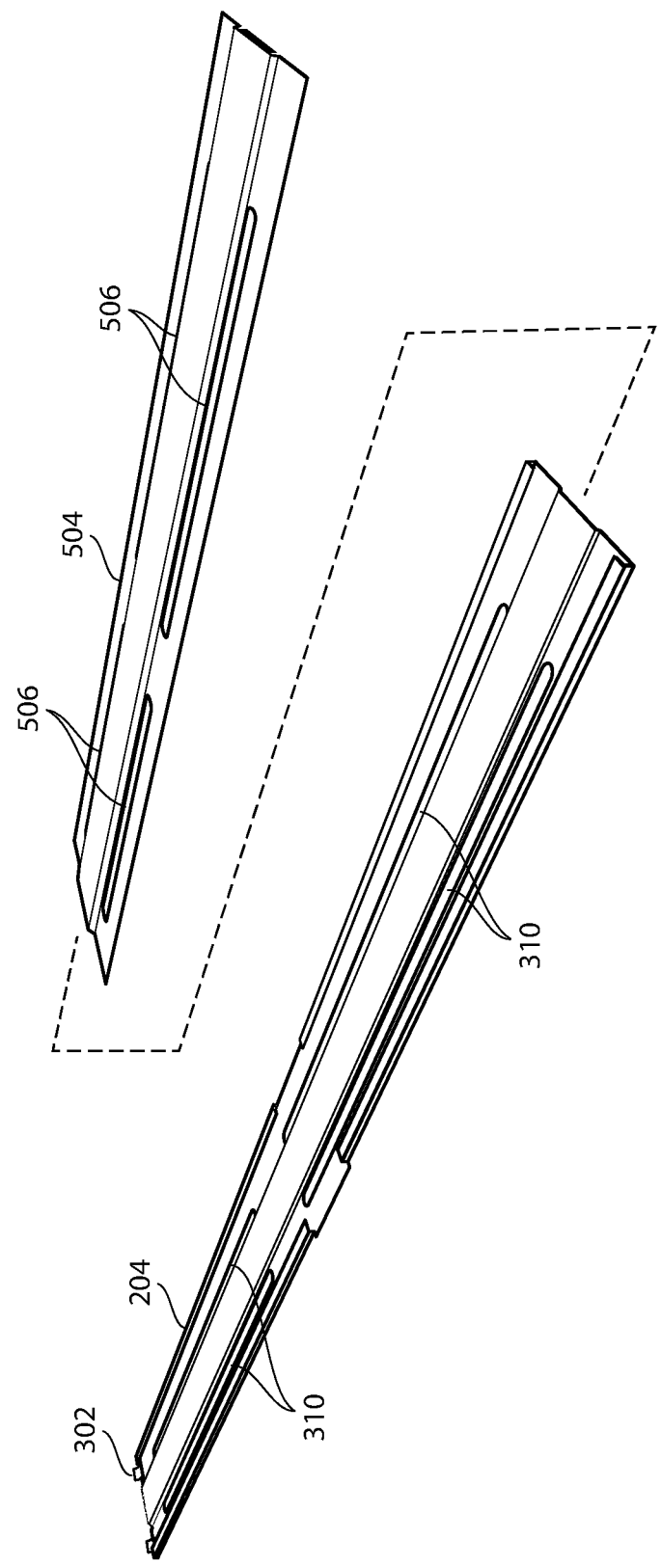
FIG. 5C is an exploded view of the lower support elements of FIG. 5A according to an embodiment of the invention.

Referring now also to FIG. 5C, a second bottom support 504 is slideably mounted within the tracks 304 of first bottom support 204. Second bottom support 504 has grooves 506 which are parallel with but lateral offset from grooves 310. Four grooves and fasteners are shown in the embodiments. However, the invention is not so limited and there may be any number of grooves and fasteners, and particularly more fasteners than grooves.

In the retracted position, second bottom support 504 preferably can retract up to stops 302 at the rear end of first bottom support 204. To deploy, second bottom support 504 can extend out with first bottom support 204, and then further by sliding through the tracks 304 to extend from first bottom support 204. A lower stop such as a protrusion or recess (not shown) with stop 404 when second bottom support reaches its maximum extension relative to first bottom support 204.

Figure 6:
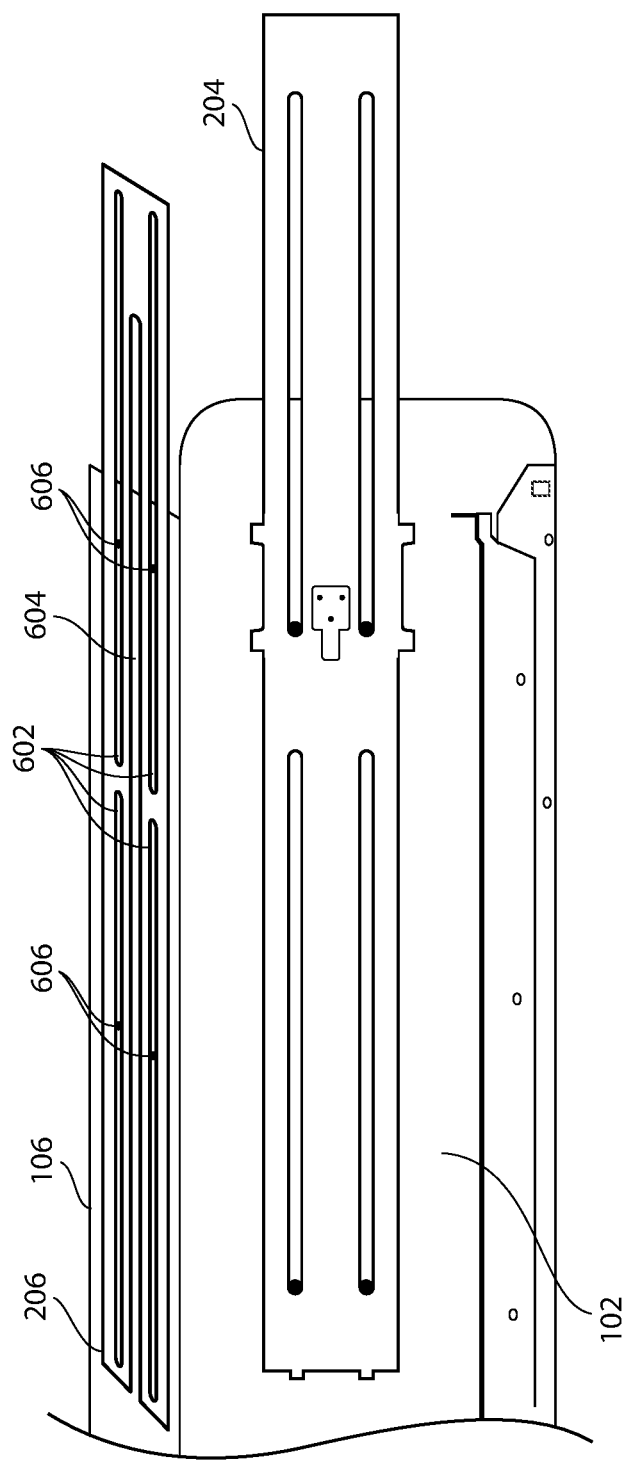
FIG. 6 is a side perspective view of the outer tray of FIG. 2A according to an embodiment of the invention.

Referring now to FIG. 6, side support 206 and its connections are shown in more detail. Side support 206 includes three rows of grooves, including top and bottom rows of grooves 602 and a central groove 604 that is open at the rear end. Fasteners 606, such as capped rivets, slideably mount side support 206 to right sidewall 106 such that side support 206 can retract into outer tray 100 and extend from outer tray 100.

Figure 7A:
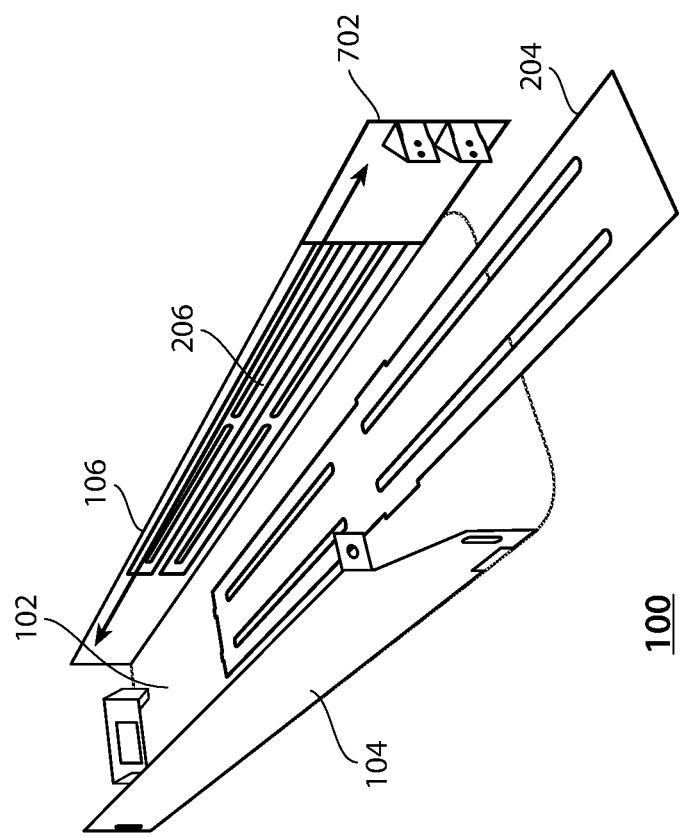
FIGS. 7A and 7B are perspective views of an outer tray of FIG. 1A with lower and right hand supporting elements according to an embodiment of the invention.
Figure 7B:
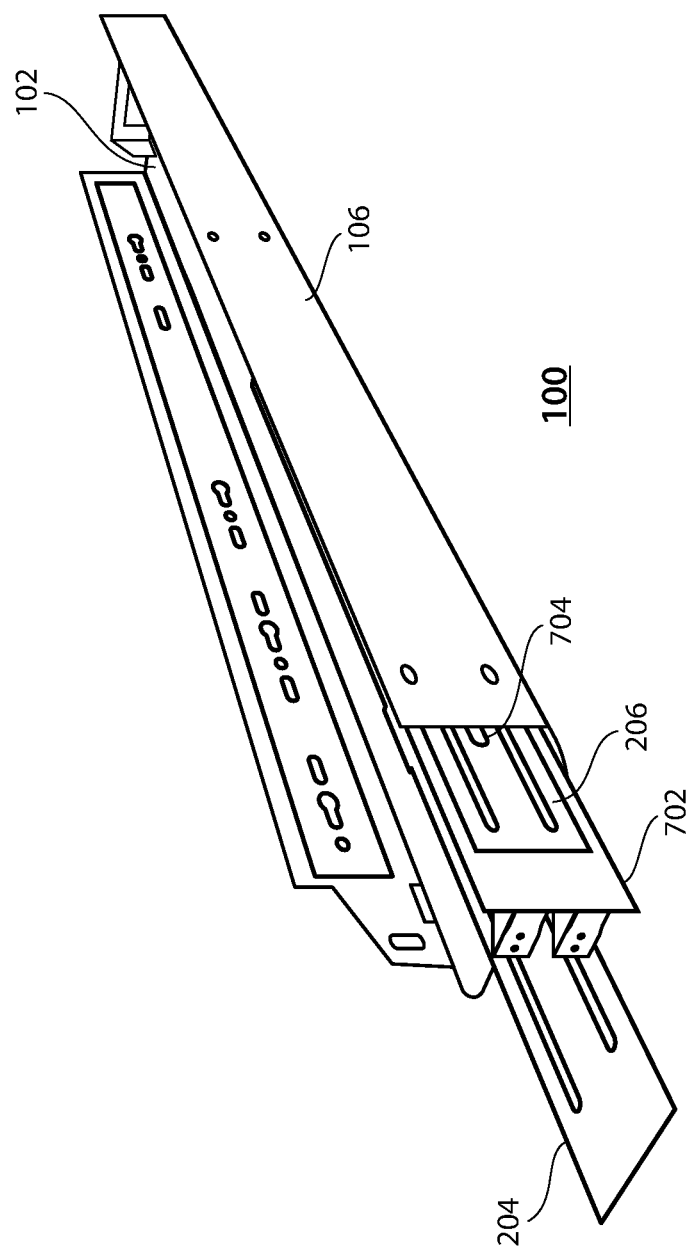

Referring now also to FIGS. 7A and 7B, an L-shaped bracket 702 is slideably mounted to side support 206 by a fastener 704 through central groove 604. This allows L-bracket 702 (and anything that it connects to) to slideably move along the length of central groove 604. The forward face of the L-bracket 702 can connect with a component supported by outer tray 100 as discussed below.

Figure 8A:
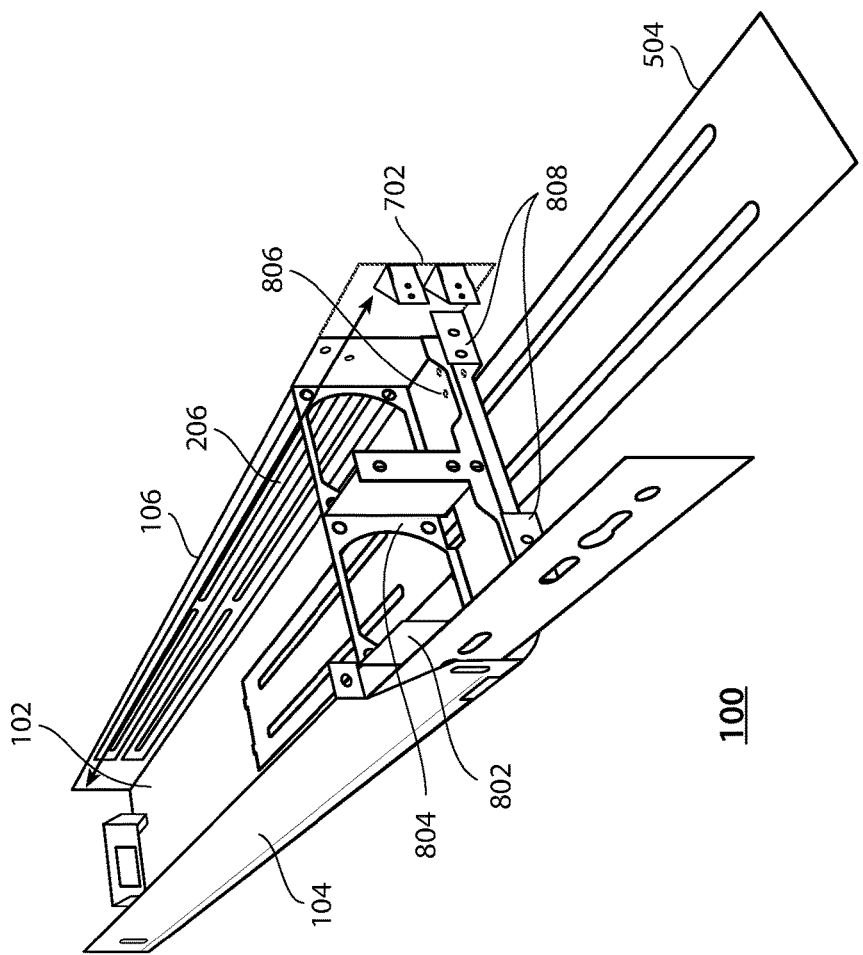
FIGS. 8A and 8B are perspective views of an outer tray of FIG. 1A with various supporting elements and a fan chassis according to an embodiment of the invention.
Figure 8B:
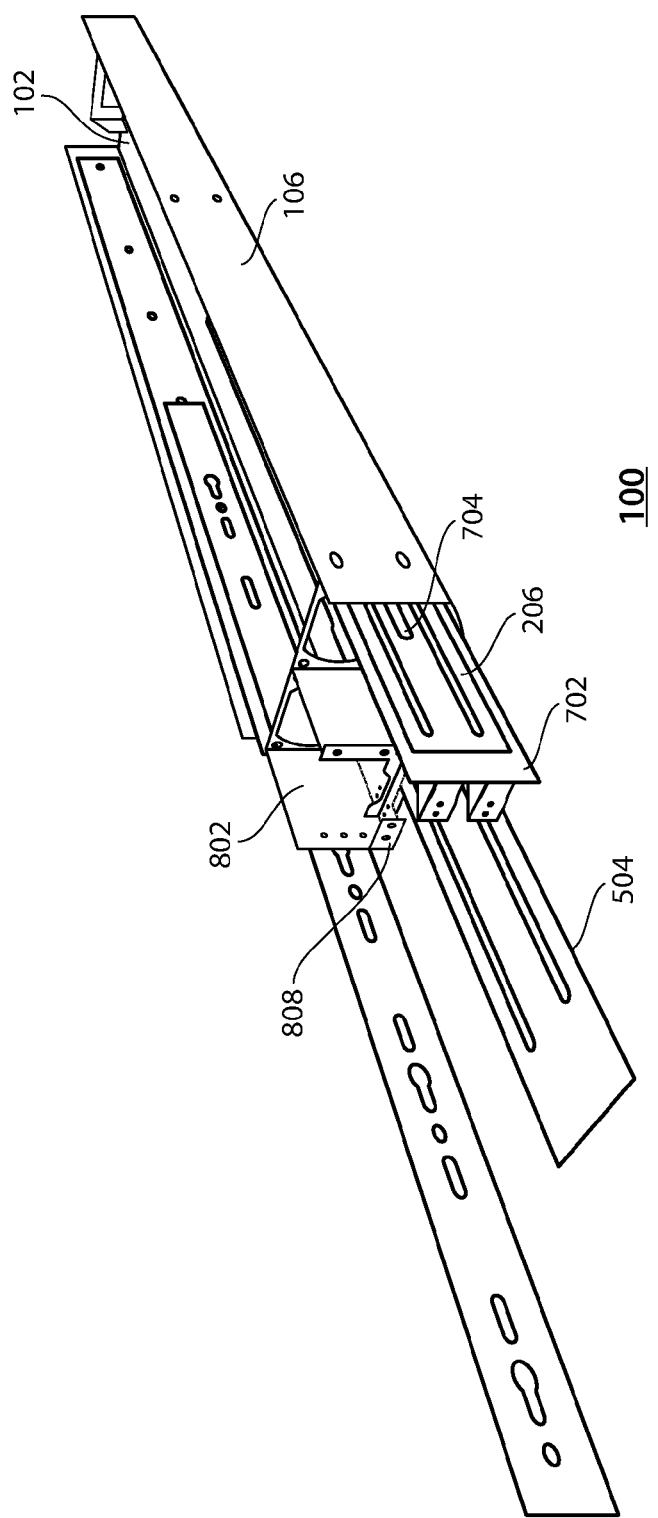

Referring now to FIGS. 8A and 8B, a fan chassis 802 with left and right fan receiving areas 804 and 806 are configured to receive left and right fans, respectively. The right side of fan chassis 802 is connected to L-bracket 702 by fasteners as is known in the art, and can thus slide with L-bracket 702 along the length of central groove 604. The rear open end of groove 604 allows the fan chassis and L-shaped bracket to be initially mounted on side support 206 via fastener 704.

Figure 9A:
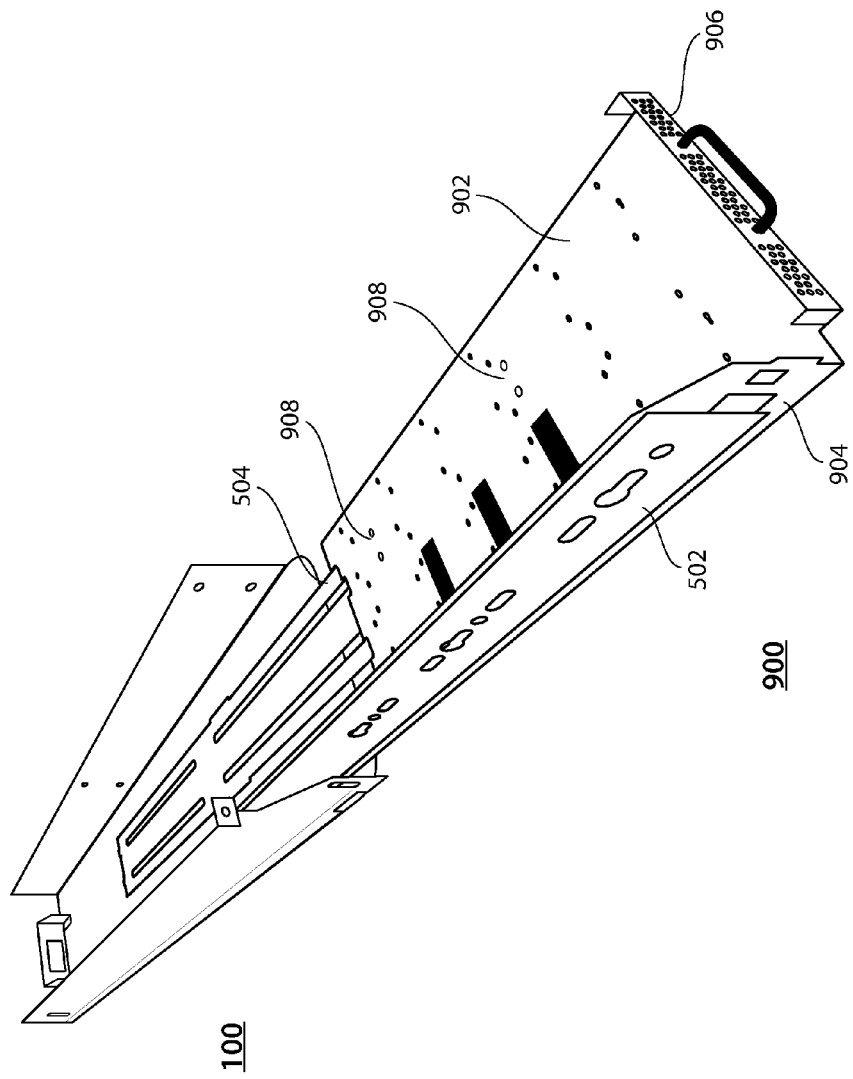
FIGS. 9A and 9B are perspectives view of an outer tray of FIG. 1A with lower and left hand supporting elements supporting an inner tray according to an embodiment of the invention.
Figure 9B:
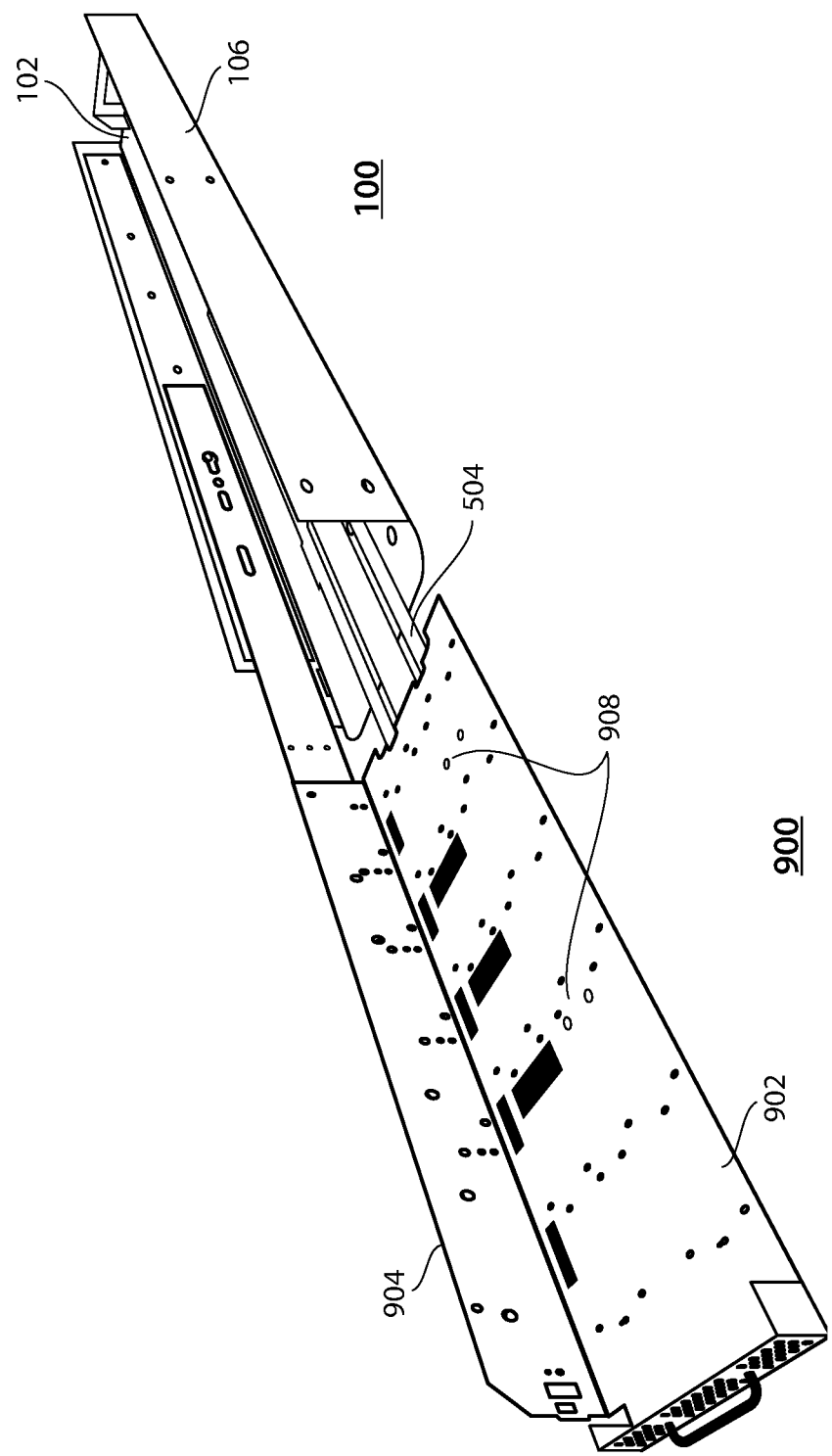

Referring now to FIGS. 9A and 9B, an inner tray 900 is shown. Inner tray 900 has a bottom 902, a left sidewall 904 and a front 906 with a handle. No right sidewall is necessary and thus not shown, although the invention does not exclude a partial or entire right sidewall.

Bottom 902 rests on top of second bottom support 504, which in turn is held level by sliding engagement with first bottom support 204. Fasteners 908, such as rivets, slideably mount bottom 902 on second bottom support 504 through grooves 506. This provides lower support for inner tray 900.

Left sidewall 904 is attached to arm 502 with fasteners as is known in the art. The combination of track 118, arm 202 and arm 502 will thus provide lateral left side support and stability for the inner tray 900.

Figure 10B:
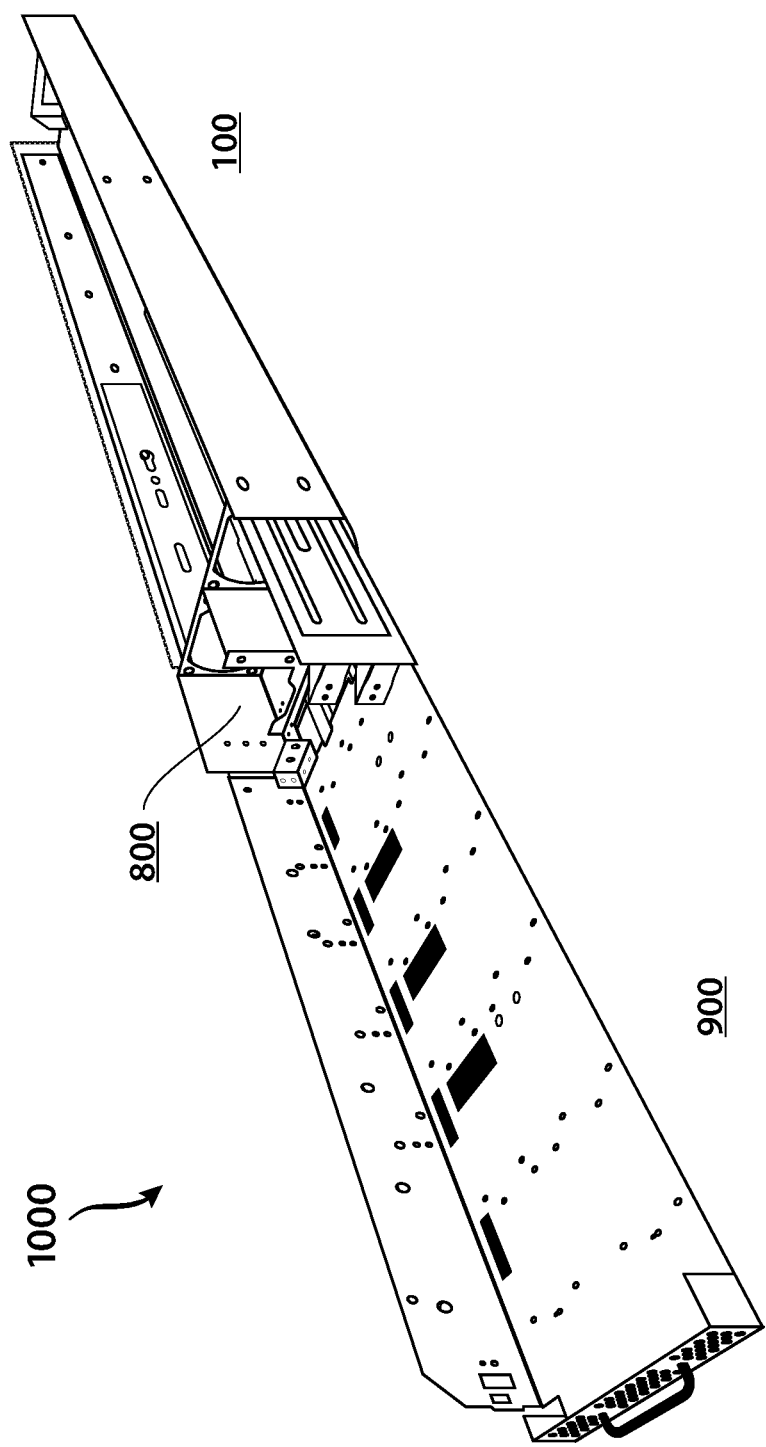

Referring now to FIGS. 10-10C, the completed assembly 1000 is shown with outer tray 100, fan chassis 800 and inner tray 900. Fan chassis 800 is attached to the rear end of inner tray 900. Side support 206 thus indirectly provides right side support to inner tray 900 through the connections with L-bracket 702 and fan chassis 800. For example, step screws or some other type of fastener can be provided between L-bracket 702 and slide support 206 to connect inner tray 900 to side support 206.

Figure 11:
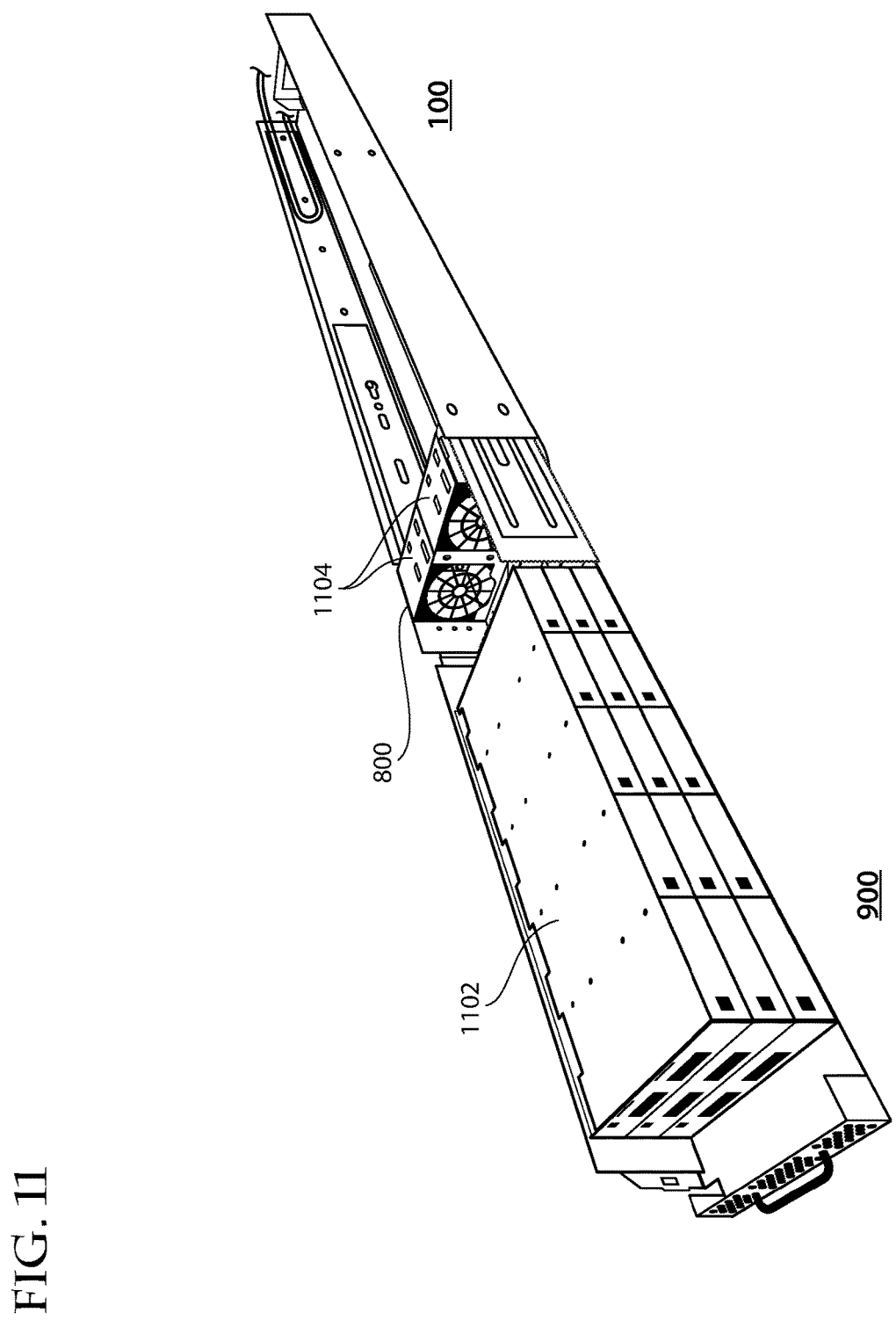
FIG. 11 is a perspective view of the completed assembly of FIGS. 10A-10C supporting fans and an electronic component according to an embodiment of the invention.

Referring now to FIG. 11, the completed assembly 1000 is shown supporting an electronic component 1102, such as an HDD (although the invention is not so limited). Fans 1104 are mounted in fan chassis 800. The back end of electronic component 1102 is connected to the front face of L-bracket 702.

The above embodiments have been described with respect to a particular left-right orientation of components. However, the invention is not so limited, and the design could be reversed for a right-left orientation of components (e.g., track 118 on the right side, side support 206 on the left side, etc.)

When in the retracted position, all components (save perhaps the very front of inner tray 900) are preferably fully retracted within outer tray 900. Movement of the inner tray 900 to a deployed position entails different types of motion on the left, bottom and right sides of outer tray 100.

On the left side, arms 202 and 502 will extend from track 118 as known in the art. Stops (not shown) are provided to prevent inadvertent removal of the nesting engagement of arms 202/502 from track 118. Inner tray 100 can extend at a maximum to the engagement of the stops of the track 118 and arms 202 and 502 as known in the art.

On the bottom side (and presuming for ease of explanation a loose connection of components), inner tray 100 will slide forward as fasteners 808 slide along grooves 506 in second bottom support 504. When fasteners 808 reach the forward end of grooves 506, further forward movement of tray 100 will begin to pull second bottom support 504 out of the tracks 304 of first bottom support 204. When the stop (not shown) on the underside of second bottom support 504 engages the stop 404, further forward movement of inner tray 900 will begin to pull first bottom support 504 forward via the engagement of grooves 310 and fasteners 402. Inner tray 100 can extend at a maximum to the engagement of the rear end of grooves 310 and fasteners 402, at which point flanges 306 of first bottom support 204 engaged gripping flanges 114 of outer tray 100.

On the right side, due to the connection of inner tray 100 to fan chassis 800 and in turn L-bracket 702, fan chassis 800 and L-bracket 702 move forward with inner tray 100, with fastener 704 sliding along center groove 604 of side support 206. When fastener 704 reaches the forward end of groove 604, further forward movement of tray 100 will begin to pull side support 206 forward via the engagement of grooves 602 with fasteners 704. Outer tray 900 can extend at a maximum to the engagement of the rear end of grooves 602 with fasteners 704.

Each of the components on the left, bottom and right sides thus allow for their own maximum extension and retraction of inner tray 900. That may be equal for all three. However, the invention is not so limited, and one or all may be different. By way of non-limiting example, the embodiments in the figures show inner tray 900 at maximum extension on the bottom, but only partial extension on the right side (side support 206 still has additional groove space available). In such a case, the shortest of the maximums establish the overall range of motion.

The above embodiments reduce the width of the outer tray 100 as compared to prior art trays. For example, the support on left side of the outer tray 100 includes (a) nested components (118, 202, 502) and (b) left sidewall 904 of inner tray 900 to connect to the nested components, and a prior art tray might have a symmetrical support on the right side. Yet support on the right side of outer tray 100 is provided by side support 206, which (a) is much thinner than the nested components on the left side, and (b) does not require any corresponding right sidewall for inner tray 900. This results in a savings or reduction on the other of about 50%, that is between about 3.5 mm to 5.5 mm in width relative to prior art trays that use nested components and sidewalls on both sides of the inner tray. There is a corresponding tradeoff in that the overlapping first and second bottom supports 204 and 504 add approximately 4.5 mm of height. The embodiments may thus be valuable for server setups where width savings is more valuable than height.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A retractable component tray holder, comprising:
   an outer tray having first and second outer tray sidewalls, and a bottom;
   an inner tray configured to retract into and extend from the outer tray, the inner tray having a first inner tray sidewall and a bottom;
   a fan chassis configured to receive at least one fan, the fan chassis being adjacent a rear of the inner tray;
   a first side support assembly comprising an inner section attached to the first outer tray sidewall and a nested outer section attached to the first inner tray sidewall;
   a bottom support assembly comprising a first bottom support slideably mounted on the bottom of the outer tray, a second bottom support slideably mounted on the first bottom support, and the inner tray being slideably mounted on the second bottom support; and
   a second side support assembly comprising a side support slideably mounted on the second sidewall, a bracket slideably mounted on the side support, and the fan chassis mounted on the bracket,
   wherein the side support has a central groove, and the bracket is sliding mounted to the central groove by a fastener.

2. The holder of claim 1, wherein the first bottom support has at least one groove and is slideably attached to an upper face of the bottom of the outer tray by at least one fastener through the at least one groove.

3. The holder of claim 1, wherein the bottom of the outer tray has upwardly extending gripping flanges, the first bottom support has outwardly extending flanges, and when the first bottom support slides into an extended position the extending flanges slide into overlapping engagement with the gripping flanges.

4. The holder of claim 3, wherein the first bottom support has side tracks to receive and support the second bottom support, the side tracks being closer together than the gripping flanges such that the first bottom support slides between the gripping flanges.

5. The holder of claim 1, wherein the second bottom support has at least one groove and is slideably attached to the bottom of the inner tray by at least one fastener through the at least one groove.

6. The holder of claim 1, wherein the side support has at least one groove and is slideably attached to a second sidewall of the inner tray by at least one fastener through the at least one groove.

7. The holder of claim 1, wherein the side support has at least one groove above and below the central groove and is slideably attached to the second sidewall of the inner tray by at least one fastener through the at least one groove.

8. The holder of claim 1, wherein the inner tray is directly connected to the first side support assembly and the bottom support assembly, and indirectly connected to the second side support assembly.

9. The holder of claim 1, wherein the inner tray lacks a second sidewall corresponding to the second sidewall of the outer tray.

10. A retractable component tray holder, comprising:
    an outer tray having first and second outer tray sidewalls, and a bottom;
    an inner tray configured to retract into and extend from the outer tray, the inner tray having a first inner tray sidewall and a bottom;
    a fan chassis configured to receive at least one fan, the fan chassis being adjacent a rear of the inner tray;
    a first side support assembly comprising an inner section attached to the first outer tray sidewall and a nested outer section attached to the first inner tray sidewall;
    a bottom support assembly comprising a first bottom support slideably mounted on the bottom of the outer tray, a second bottom support slideably mounted on the first bottom support, and the inner tray being slideably mounted on the second bottom support; and
    a second side support assembly comprising a side support slideably mounted on the second sidewall, a bracket slideably mounted on the side support, and the fan chassis mounted on the bracket
    the inner tray being directly connected to the first side support assembly and the bottom support assembly, and indirectly connected to the second side support assembly;
    wherein the inner tray lacks a second sidewall corresponding to the second sidewall of the outer tray, and
    wherein the side support has a central groove, and the bracket is sliding mounted to the central groove by a fastener.

11. The holder of claim 10, wherein the first bottom support has at least one groove and is slideably attached to an upper face of the bottom of the outer tray by at least one fastener through the at least one groove.

12. The holder of claim 10, wherein the bottom of the outer tray has upwardly extending gripping flanges, the first bottom support has outwardly extending flanges, and when the first bottom support slides into an extended position the extending flanges slide into overlapping engagement with the gripping flanges.

13. The holder of claim 12, wherein the first bottom support has side tracks to receive and support the second bottom support, the side tracks being closer together than the gripping flanges such that the first bottom support slides between the gripping flanges.

14. The holder of claim 10, wherein the second bottom support has at least one groove and is slideably attached to the bottom of the inner tray by at least one fastener through the at least one groove.

15. The holder of claim 10, wherein the side support has at least one groove and is slideably attached to a second sidewall of the inner tray by at least one fastener through the at least one groove.

16. The holder of claim 10, wherein the side support has at least one groove above and below the central groove and is slideably attached to the second sidewall of the inner tray by at least one fastener through the at least one groove.

17. A retractable component tray holder, comprising:
- an outer tray having first and second outer tray sidewalls, and a bottom;
- an inner tray configured to retract into and extend from the outer tray, the inner tray having a first inner tray sidewall and a bottom;
- a fan chassis configured to receive at least one fan, the fan chassis being adjacent a rear of the inner tray;
- a first side support assembly comprising an inner section attached to the first outer tray sidewall and a nested outer section attached to the first inner tray sidewall;
- a bottom support assembly comprising a first bottom support slideably mounted on the bottom of the outer tray, a second bottom support slideably mounted on the first bottom support, and the inner tray being slideably mounted on the second bottom support; and
- a second side support assembly comprising a side support slideably mounted on the second sidewall, a bracket slideably mounted on the side support, and the fan chassis mounted on the bracket, wherein the bottom of the outer tray has upwardly extending gripping flanges, the first bottom support has outwardly extending flanges, and when the first bottom support slides into an extended position the extending flanges slide into overlapping engagement with the gripping flanges, and wherein the first bottom support has side tracks to receive and support the second bottom support, the side tracks being closer together than the gripping flanges such that the first bottom support slides between the gripping flanges.

18. The holder of claim 17, wherein the first bottom support has at least one groove and is slideably attached to an upper face of the bottom of the outer tray by at least one fastener through the at least one groove.

19. The holder of claim 17, wherein the second bottom support has at least one groove and is slideably attached to the bottom of the inner tray by at least one fastener through the at least one groove.

20. The holder of claim 17, wherein the side support has at least one groove and is slideably attached to the second sidewall of the inner tray by at least one fastener through the at least one groove.

* * * * *